United States Patent
Kar et al.

(10) Patent No.: US 11,416,659 B1
(45) Date of Patent: Aug. 16, 2022

(54) IMPLEMENTING AN ASYMMETRIC MEMORY WITH RANDOM PORT RATIOS USING DEDICATED MEMORY PRIMITIVES

(71) Applicant: Xilinx, Inc., San Jose, CA (US)

(72) Inventors: Pradip Kar, San Jose, CA (US); Nithin Kumar Guggilla, Hyderabad (IN); Bing Tian, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 324 days.

(21) Appl. No.: 16/834,797

(22) Filed: Mar. 30, 2020

(51) Int. Cl.
*G06F 30/31* (2020.01)
*G06F 12/02* (2006.01)
*G06F 30/39* (2020.01)
*G06F 30/398* (2020.01)
*G06F 30/392* (2020.01)

(52) U.S. Cl.
CPC ............ *G06F 30/31* (2020.01); *G06F 12/023* (2013.01); *G06F 30/39* (2020.01); *G06F 30/392* (2020.01); *G06F 30/398* (2020.01); *G06F 2212/657* (2013.01)

(58) Field of Classification Search
CPC ...................................................... G06F 30/31
USPC ........................................................ 716/102
See application file for complete search history.

(56) References Cited

U.S. PATENT DOCUMENTS 7,590,965 B1 * 9/2009 Ingoldby ................. G06F 30/34
716/102

* cited by examiner

*Primary Examiner* — Eric D Lee
(74) *Attorney, Agent, or Firm* — Kevin T. Cuenot

(57) ABSTRACT

Implementing an asymmetric memory having random port ratios using memory primitives can include detecting, using computer hardware, a hardware description language (HDL) random access memory (RAM) within a circuit design. The HDL RAM is asymmetric. Using computer hardware, a number of a plurality of memory primitives needed to implement the HDL RAM as a RAM circuit are determined based on a maximum port width ratio of the memory primitives defined as 1:N and a port width ratio of the HDL RAM defined as 1:M, wherein each of M and N is an integer and a power of two and M exceeds N. The RAM circuit is asymmetric. Using the computer hardware, a write circuit and/or a read circuit can be generated for a first port of the RAM circuit. Further, using the computer hardware, a write circuit and/or a read circuit can be generated for a second port of the RAM circuit.

20 Claims, 14 Drawing Sheets

| Read Location | HDL RAM 202 Output | Memory Primitive 208 Output | Memory Primitive 206 Output | RAM Circuit 204 Output |
|---|---|---|---|---|
| 0 | {D, C, B, A} | {D, C} | {B, A} | {D, C, B, A} |
| 1 | {H, G, F, E} | {H, G} | {F, E} | {H, G, F, E} |
| 2 | {L, K, J, I} | {L, K} | {J, I} | {L, K, J, I} |
| 3 | {P, O, N, M} | {P, O} | {N, M} | {P, O, N, M} |

| HDL RAM | | Memory Primitive 208 | | | Memory Primitive 206 | | |
|---|---|---|---|---|---|---|---|
| WADDR | DIN | WADDR-208 | WEN-208 | DIN-208 | WADDR-206 | WEN-206 | DIN-206 |
| 0000 | A | XXX | 0 | X | 000 | 1 | A |
| 0001 | B | XXX | 0 | X | 001 | 1 | B |
| 0010 | C | 000 | 1 | C | XXX | 0 | X |
| 0011 | D | 001 | 1 | D | XXX | 0 | X |
| 0100 | E | XXX | 0 | X | 010 | 1 | E |
| 0101 | F | XXX | 0 | X | 011 | 1 | F |
| 0110 | G | 010 | 1 | G | XXX | 0 | X |
| 0111 | H | 011 | 1 | H | XXX | 0 | X |
| 1000 | I | XXX | 0 | X | 100 | 1 | I |
| 1001 | J | XXX | 0 | X | 101 | 1 | J |
| 1010 | K | 100 | 1 | K | XXX | 0 | X |
| 1011 | L | 101 | 1 | L | XXX | 0 | X |
| 1100 | M | XXX | 0 | X | 110 | 1 | M |
| 1101 | N | XXX | 0 | X | 111 | 1 | N |
| 1110 | O | 110 | 1 | O | XXX | 0 | X |
| 1111 | P | 111 | 1 | P | XXX | 0 | X |

FIG. 4

| Write Location | HDL RAM 602 Input | Memory Primitive 608 Input | Memory Primitive 606 Input | RAM Circuit 604 Input |
|---|---|---|---|---|
| 0 | {D, C, B, A} | {D, C} | {B, A} | {D, C, B, A} |
| 1 | {H, G, F, E} | {H, G} | {F, E} | {H, G, F, E} |
| 2 | {L, K, J, I} | {L, K} | {J, I} | {L, K, J, I} |
| 3 | {P, O, N, M} | {P, O} | {N, M} | {P, O, N, M} |

| HDL RAM | | Memory Primitive 608 | | Memory Primitive 606 | | Multiplexer Select |
|---|---|---|---|---|---|---|
| RADDR | DOUT | RADDR-608 | DOUT-608 | RADDR-206 | DOUT-606 | 0=>208, 1=>206 |
| 0000 | A | XXX | X | 000 | A | 0 |
| 0001 | B | XXX | X | 001 | B | 0 |
| 0010 | C | 000 | C | XXX | X | 1 |
| 0011 | D | 001 | D | XXX | X | 1 |
| 0100 | E | XXX | X | 010 | E | 0 |
| 0101 | F | XXX | X | 011 | F | 0 |
| 0110 | G | 010 | G | XXX | X | 1 |
| 0111 | H | 011 | H | XXX | X | 1 |
| 1000 | I | XXX | X | 100 | I | 0 |
| 1001 | J | XXX | X | 101 | J | 0 |
| 1010 | K | 100 | K | XXX | X | 1 |
| 1011 | L | 101 | L | XXX | X | 1 |
| 1100 | M | XXX | X | 110 | M | 0 |
| 1101 | N | XXX | X | 111 | N | 0 |
| 1110 | O | 110 | O | XXX | X | 1 |
| 1111 | P | 111 | P | XXX | X | 1 |

Detect a hardware description language (HDL) random access memory (RAM) within a circuit design, wherein the HDL RAM is asymmetric
1502

Determine a number of a plurality of memory primitives needed to implement a RAM circuit based on a maximum port width ratio of the memory primitives defined as 1:N and a port width ratio of the HDL RAM defined as 1:M, wherein M and N each is a power of two and M exceeds N, and wherein the RAM circuit is asymmetric
1504

Generate a write circuit for a first port of the RAM circuit
1506

Generate a read circuit for a second port of the RAM circuit
1508

FIG. 15

IMPLEMENTING AN ASYMMETRIC MEMORY WITH RANDOM PORT RATIOS USING DEDICATED MEMORY PRIMITIVES

TECHNICAL FIELD

This disclosure relates to integrated circuits (ICs) and, more particularly, to implementing an asymmetric memory with a random port ratio using dedicated memory primitives within an IC.

BACKGROUND

Some ICs are manufactured to include predefined circuit blocks referred to as primitives that may be used to implement a user's circuit design. As an example, a programmable IC such as a field programmable gate array (FPGA) may include a variety of different types of memory type primitives (memory primitives). Examples include various types of random-access memory (RAM) circuit blocks that may be connected to other circuits and/or systems in the IC to implement a user's circuit design.

Some memory primitives support read and write access to the memory content stored therein via two ports that may have different widths. Both ports of the memory primitive are able to access the same physical memory albeit using a different logical organization of the RAM. As an example, a 32 kb memory primitive may be accessed via a first port using 12 bit addresses and an 8 bit words. The same 32 kb memory primitive may be accessed via a second port using 10 bit addresses and 32 bit words. A memory primitive that uses different logical organizations (e.g., different addressing and word sizes) on each port is considered asymmetric.

Some Electronic Design Automation (EDA) tools are capable of analyzing a circuit design and implementing an asymmetric memory so long as very specific aspect ratios are observed. That is, the EDA tools only support creation of asymmetric memories with limited, particular, and predetermined aspect ratios that are limited by the native aspect ratios supported by the memory primitives available on the target IC. Thus, in cases where a user design utilizes an aspect ratio that is not natively supported by an available memory primitive, the EDA tools are unable to process and/or implement the asymmetric memory of from the user's circuit design in the target IC.

SUMMARY

In one aspect, a method can include detecting, using computer hardware, a hardware description language (HDL) random access memory (RAM) within a circuit design, wherein the HDL RAM is asymmetric. The method can include determining, using the computer hardware, a number of a plurality of memory primitives needed to implement the HDL RAM as a RAM circuit based on a maximum port width ratio of the memory primitives defined as 1:N and a port width ratio of the HDL RAM defined as 1:M. Each of M and N is an integer and a power of two and M exceeds N. Further, the RAM circuit is asymmetric. The method also can include generating, using the computer hardware, a write circuit for a first port of the RAM circuit and generating, using the computer hardware, a read circuit for a second port of the RAM circuit.

In another aspect, a system includes a processor configured to initiate operations. The operations include detecting an HDL RAM within a circuit design, wherein the HDL RAM is asymmetric. The operations can include determining a number of a plurality of memory primitives needed to implement the HDL RAM as a RAM circuit based on a maximum port width ratio of the memory primitives defined as 1:N and a port width ratio of the HDL RAM defined as 1:M. Each of M and N is an integer and a power of two and M exceeds N. Further, the RAM circuit is asymmetric. The operations also can include generating a write circuit for a first port of the RAM circuit and generating a read circuit for a second port of the RAM circuit.

A computer program product includes one or more computer readable storage media, and program instructions collectively stored on the one or more computer readable storage media, wherein the program instructions are executable by computer hardware to initiate operations. The operations can include detecting an HDL RAM within a circuit design, wherein the HDL RAM is asymmetric. The operations can include determining a number of a plurality of memory primitives needed to implement the HDL RAM as a RAM circuit based on a maximum port width ratio of the memory primitives defined as 1:N and a port width ratio of the HDL RAM defined as 1:M. Each of M and N is an integer and a power of two and M exceeds N. Further, the RAM circuit is asymmetric. The operations also can include generating a write circuit for a first port of the RAM circuit and generating a read circuit for a second port of the RAM circuit.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

FIG. 4 is a table illustrating that by controlling the write enable of memory primitives, input data can be successfully written to the memory primitives of FIG. 2.

FIG. 8 is a table illustrating that by controlling the multiplexer, output data can be successfully read from the memory primitives of FIG. 6.

FIG. 15 is an example method illustrating operations performed by a system to implement a RAM circuit derived from an HDL RAM of a circuit design.

DETAILED DESCRIPTION

Figure 1:
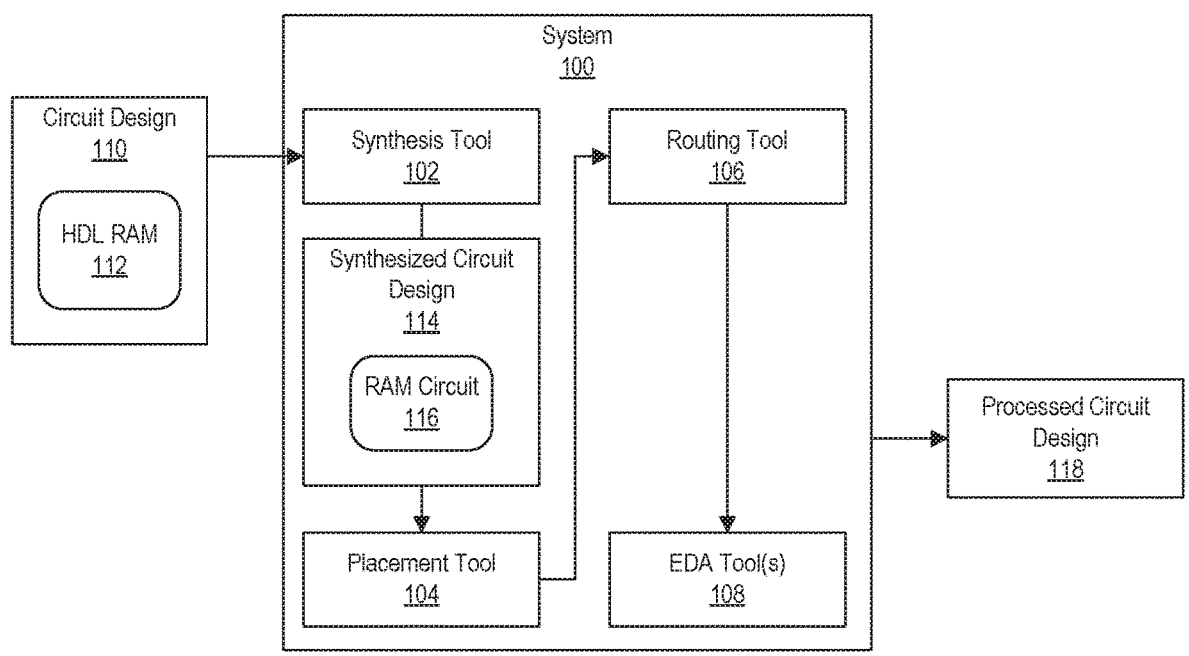
FIG. 1 illustrates an example of a system for implementing a circuit design.

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to integrated circuits (ICs) and, more particularly, to implementing an asymmetric random access memory (RAM) having a random port ratio using dedicated memory circuit blocks within an IC. Asymmetric memories are often used to create storage and buffering between two data streams in a circuit design where the data streams have different widths. As an example, consider an asymmetric FIFO memory that receives input data that is 8 bits in width and outputs data that is 32 bits in width. In this example, the write operations occur at 4 times the speed of the read operations for data buffering.

As discussed, conventional EDA tools are constrained in terms of implementing user circuit designs that call for asymmetric memories. The EDA tools are only able to implement such circuit designs when the available memory primitives natively support the port aspect ratio called for by the user circuit design. A memory primitive refers to a dedicated or predetermined memory circuit block that is available on a particular target IC. Typically, the memory primitive is the smallest unit or circuit block of that type (e.g., a memory in this case) that is available in the target IC.

For example, some ICs provide memory primitives with ports supporting widths as narrow as 1 bit and as wide as 32 bits corresponding to a maximum port aspect ratio of 1:32. Other ICs provide memory primitives with ports as narrow as 9 bits and as wide as 36 bits corresponding to a maximum port aspect ratio of 1:4. Still other ICs provide primitives with ports as narrow as 9 bits and as wide as 72 bits corresponding to a maximum port aspect ratio of 1:8. EDA tools implementing a user circuit design for each such target IC would only be capable of implementing asymmetric memories in each respective IC that are natively supported by the respective memory primitives. The limitations on the EDA tools vary with the port aspect ratios of the available memory primitives.

In accordance with the inventive arrangements described within this disclosure, an EDA tool is disclosed that is capable of implementing asymmetric memories, e.g., RAMs, having a random port aspect ratio. The EDA tool is not constrained by the particular maximum port aspect ratio of the available memory primitives of the target IC. The EDA tool is capable of generating additional circuitry to achieve an arbitrary, or random, port aspect ratio as may be specified in a user circuit design given the available memory primitives of the target IC. Example methods, systems, and computer-program products are disclosed that are capable of generating circuit designs with asymmetric memories with random port aspect ratios.

Further aspects of the inventive arrangements are described below in greater detail with reference to the figures. For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

FIG. 1 illustrates an example of a system 100 for implementing a circuit design. System 100 illustratively includes a synthesis tool 102, a placement tool 104, a routing tool 106, and one or more other optional EDA tool(s) 108. In one aspect, synthesis tool 102, placement tool 104, routing tool 106, and EDA tool(s) 108 are operatively coupled or communicatively linked so as to operate in coordination with one other to implement a design flow through which a circuit design 110 may be processed. In an example implementation, system 100 is implemented as a set of computer system instructions (software) that execute on one or more processors such as processor(s) 1706 of computer 1702 described with reference to FIG. 17. In other examples, system 100 can be implemented as dedicated circuitry or as a combination of circuitry and software.

System 100 is capable of receiving circuit design 110 as input. Circuit design 110 may be specified using a hardware description language (HDL), e.g., as a register transfer level (RTL) description. Examples of HDLs include, but are not limited to, VHDL and Verilog. In the example of FIG. 1, circuit design 110 includes an HDL RAM 112. HDL RAM 112 is an asymmetric RAM characterized, at least in part, by having a read port width that is different from a write port width.

In one aspect, HDL RAM 112 may be a simple dual port RAM. For example, HDL RAM 112 may support only read operations on the first, narrow port and only write operations on the second, wide port. In another example, HDL RAM 112 may support only write operations on the first, narrow port and only read operations on the second, wide port. In another aspect, HDL RAM 112 may be a true dual port RAM. For example, HDL RAM 112 may support both read and write operations on a first, narrow port and both read and write operations on a second, wide port.

HDL RAM 112 is specified as a data structure in HDL. HDL RAM 112 is not yet implemented or specified in the form of memory primitives and/or additional circuit blocks that are available in the target IC. For example, HDL RAM 112 is not yet synthesized into a netlist.

Example 1 below illustrates an example of HDL RAM 112 as may be included within circuit design 110. The HDL RAM specified by Example 1 writes one 8 bit word per clock cycle and reads 4 consecutive 8 bit words each clock cycle.

Example 1

```
always @(posedge clkB) begin
    integer i; reg [log2RATIO-1:0] lsbaddr;
    for (i = 0; i < RATIO; i = i+1) begin
        lsbaddr = i;
        readB[i*minWIDTH +:minWIDTH] <= RAM[{addrB, lsbaddr}];
    end
end
```

Synthesis tool 102 is capable of synthesizing circuit design 110 to convert circuit design 110 from an HDL description to a netlist, e.g., a gate level implementation, and map the netlist to primitives available on the target IC. In the example of FIG. 1, the synthesized and mapped version of circuit design 110 is illustrated as synthesized circuit design 114. Synthesized circuit design 114 may specify circuit design 110 in terms of the primitives available on the particular IC in which the circuit design is to be implemented (e.g., the target IC).

In the example of FIG. 1, synthesis tool 102 has transformed HDL RAM 112 into a RAM circuit 116. HDL RAM 112 may have any of a variety of different port ratios that cannot be natively implemented using an available memory primitive of the target IC. In accordance with the inventive arrangements described herein, synthesis tool 102 is capable of automatically creating RAM circuit 116 from a plurality of memory primitives available in the target IC. RAM circuit 116 further includes any read and/or write circuit(s), as automatically generated by synthesis tool 102, to support read and/or write operations via the ports of RAM circuit 116. RAM circuit 116, as implemented by system 100, is asymmetric as is HDL RAM 112 from which RAM circuit 116 is derived.

Placement tool 104 is capable of performing placement to assign elements of synthesized circuit design 116 to particular instances of circuit blocks and/or resources having specific locations on a target IC. Routing tool 106 is capable of routing the placed circuit design. EDA tool(s) 108, if included, may perform additional operations. The additional operations may include, but are not limited to, preparing the circuit design for implementation as hardware within an IC. For example, the additional operations may include bitstream generation.

System 100, subsequent to performing one or more or all of synthesis, placement, routing, and/or other operations, outputs processed circuit design 118. Processed circuit design 118 may be implemented in the target IC. In one aspect, the target IC is a programmable IC. An example of a programmable IC is a field programmable gate array (FPGA) that includes programmable circuitry or logic or an IC that includes both dedicated or hardwired circuitry and programmable circuitry or logic.

System 100 is capable of automatically implementing any of a variety of asymmetric HDL RAMs that may be specified in user circuit designs. In one aspect, system 100 utilizes a technique that is agnostic to the particular limitations of the memory primitives that are used. This allows system 100 to automatically implement asymmetric HDL RAMs detected within user circuit designs for any of a variety of different target ICs that may utilize varying and/or different memory primitives, each having different aspect ratios. Thus, while the architecture of ICs and memory primitives for such ICs may change over time, system 100 is capable of continuing to automatically implement asymmetric HDL RAMs within such ICs without modification.

Within this disclosure, for purposes of illustration and ease of description, the following terms are used and/or defined. The term "base port" mean a port of an asymmetric HDL RAM or asymmetric RAM circuit that performs read and/or write operations and is narrow in terms of bit width. The term "asymmetric port" means a port of an asymmetric HDL RAM or asymmetric RAM circuit that performs read and/or write operations and is wider than the base port in terms of bit width. The aspect ratio of an asymmetric HDL RAM or asymmetric RAM circuit is a ratio of the width of the base port to the width of the asymmetric port. The term "HDL RAM" means a technology independent description of the particular asymmetric RAM of a circuit design to be implemented on a target IC. A "simple dual port RAM" refers to an asymmetric HDL RAM or an asymmetric RAM circuit derived from the asymmetric HDL RAM where one port of the RAM is designated for read operations only and a second port of the RAM is designated for write operations only. A "true dual port RAM" refers to an asymmetric HDL RAM or an asymmetric RAM circuit derived from the asymmetric HDL RAM where both of the ports are capable of performing read operations and write operations.

Figures 2, 3:
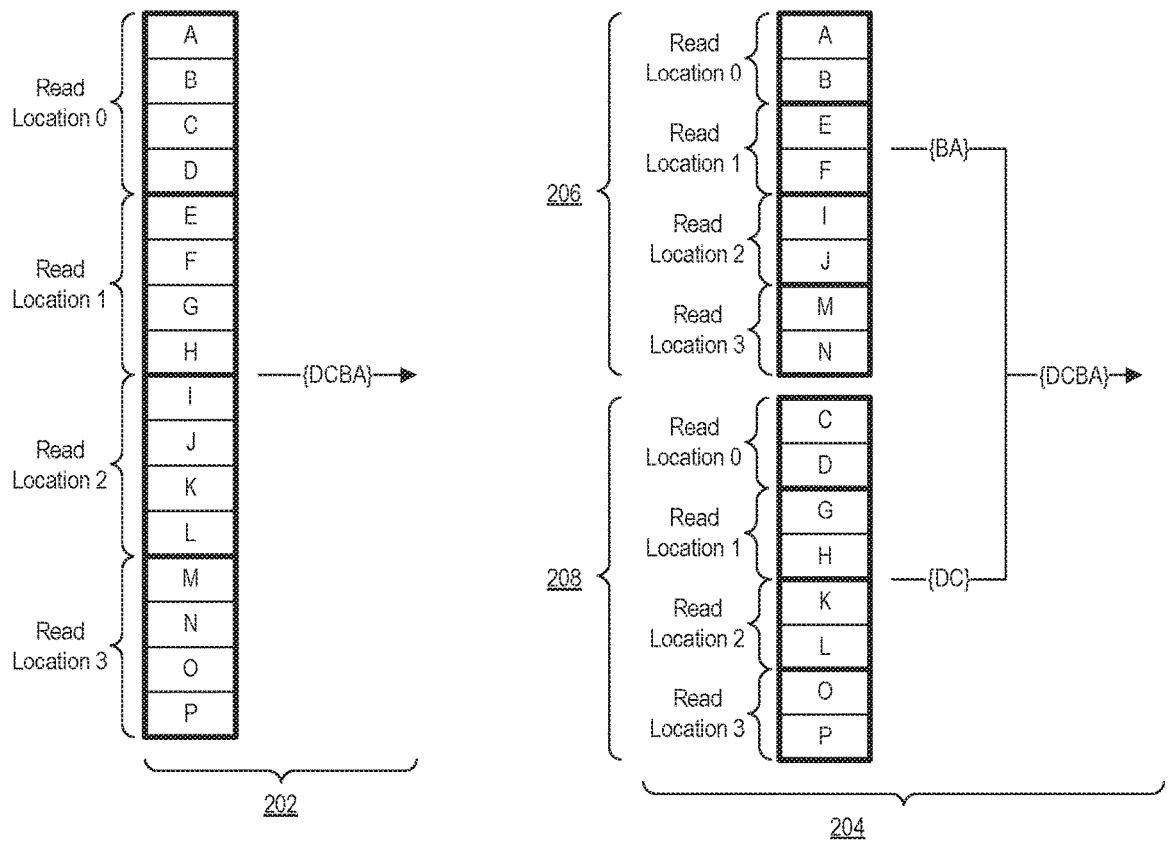
FIG. 2 is a diagram illustrating certain operative features of the system of FIG. 1.
FIG. 3 illustrates read locations and outputs generated by the HDL RAM and RAM circuit of FIG. 2.

FIG. 2 is a diagram illustrating certain operative features of system 100 of FIG. 1. FIG. 2 illustrates an example HDL RAM 202 and a corresponding RAM circuit 204. HDL RAM 202 and RAM circuit 204 are asymmetric. The system generates RAM circuit 204 from HDL RAM 202. FIG. 2 illustrates example data arrangements supporting read operations.

In the example of FIG. 2, consider the case where HDL RAM 202 has an aspect ratio of 1:4 and is to be implemented using a memory primitive having a maximum aspect ratio of 1:2. In this example, HDL RAM 202 has a read port that is wider than the write port. This means that HDL RAM 202 is written with 1 word in a clock cycle and reads out 4 consecutive words in a clock cycle. The memory primitive used to implement HDL RAM 202 only supports reading 2 consecutive words in a clock cycle.

HDL RAM 202 stores words denoted as A, B, C, D, E, F, G, H, I, J, K, L, M, N, O, and P at consecutive locations in memory. RAM circuit 204 is formed of memory primitives 206, 208, each having a maximum aspect ratio of 1:2 and only capable of reading out 2 consecutive words each clock cycle. Accordingly, the system implements RAM circuit 204 with the words re-arranged so that the same content, e.g., using a same read address provided to each of memory primitives 206, 208, may be read out on each clock cycle. This allows the same content to be read from RAM circuit 204 that is read out of HDL RAM 202 each clock cycle. The words are re-arranged to illustrate the location of the words as stored in consecutive locations within memory primitives 206, 208 of RAM circuit 204. To support reading out 4 words, RAM circuit 204 reads out two words from each memory primitive 206, 208 each clock cycle and concatenates the outputs as shown. RAM circuit 204 is illustrated without any auxiliary circuits (e.g., read or write circuits) supporting read and write operations for ease of illustration.

FIG. 3 illustrates read locations and outputs generated by HDL RAM 202 and RAM circuit 204 formed of memory primitives 206, 208 as generated by the system. FIG. 3 illustrates memory organization and output of HDL RAM 202 and RAM circuit 204.

To implement RAM circuit 204, the system generates several different circuits. For example, the system generates a core array, a read circuit, and a write circuit. In terms of the read circuit for the example of FIG. 2, the number of words read from HDL RAM 202 is the same as the number of words read from RAM circuit 204. The corresponding read locations also match. For example, when reading from the nth location of HDL RAM 202, the nth location from each of memory primitives 206 and 208 of RAM circuit 204 are read. The read address from HDL RAM 202 does not require any transformation for use in RAM circuit 204. Similarly, the read enable signal from HDL RAM 202 does not require any transformation for use in RAM circuit 204. The system generates and adds concatenation circuitry at the output of RAM circuit 204 to combine the output from each of memory primitives 206, 208.

In terms of the write circuit for the example of FIG. 2, the number of words in HDL RAM 202 is twice of that memory primitive 206 and memory primitive 208. The contents of memory primitive 206 and memory primitive 208 are interleaved based on aspect ratio. As such, the system implements the write address and write enables for memory primitive 206 and memory primitive 208 as a function of the original write address and write enable for HDL RAM 202. Word size of HDL RAM 202 is the same as memory primitive 206 and memory primitive 208. The input data may not require transformation. The system can determine the write address and write enable transformations from the example table of FIG. 4.

FIG. 4 is a table illustrating that by controlling the write enable of memory primitive 206 and memory primitive 208, the input data can be successfully written to memory primitives 206, 208. The system, for example, may generate the following expressions:

$WADDR_{MP206} == WADDR_{MP208} == \{WADDR[3:2], WADDR[0]\}$ (excluding bit WADDR[1])

$WEN_{MP206} = \sim WADDR[1]$ & WEN when WEN is HDL RAM's write enable $WEN_{MP208} = WADDR[1]$ & WEN when WEN is HDL RAM's write enable $DIN_{MP206} == DIN_{MP208} == DIN$ when DIN is Data Input of HDL RAM Within the foregoing example expressions, WADDR stands for write address. DIN stands for data input of the HDL RAM. MP stands for memory primitive.

Figure 5:
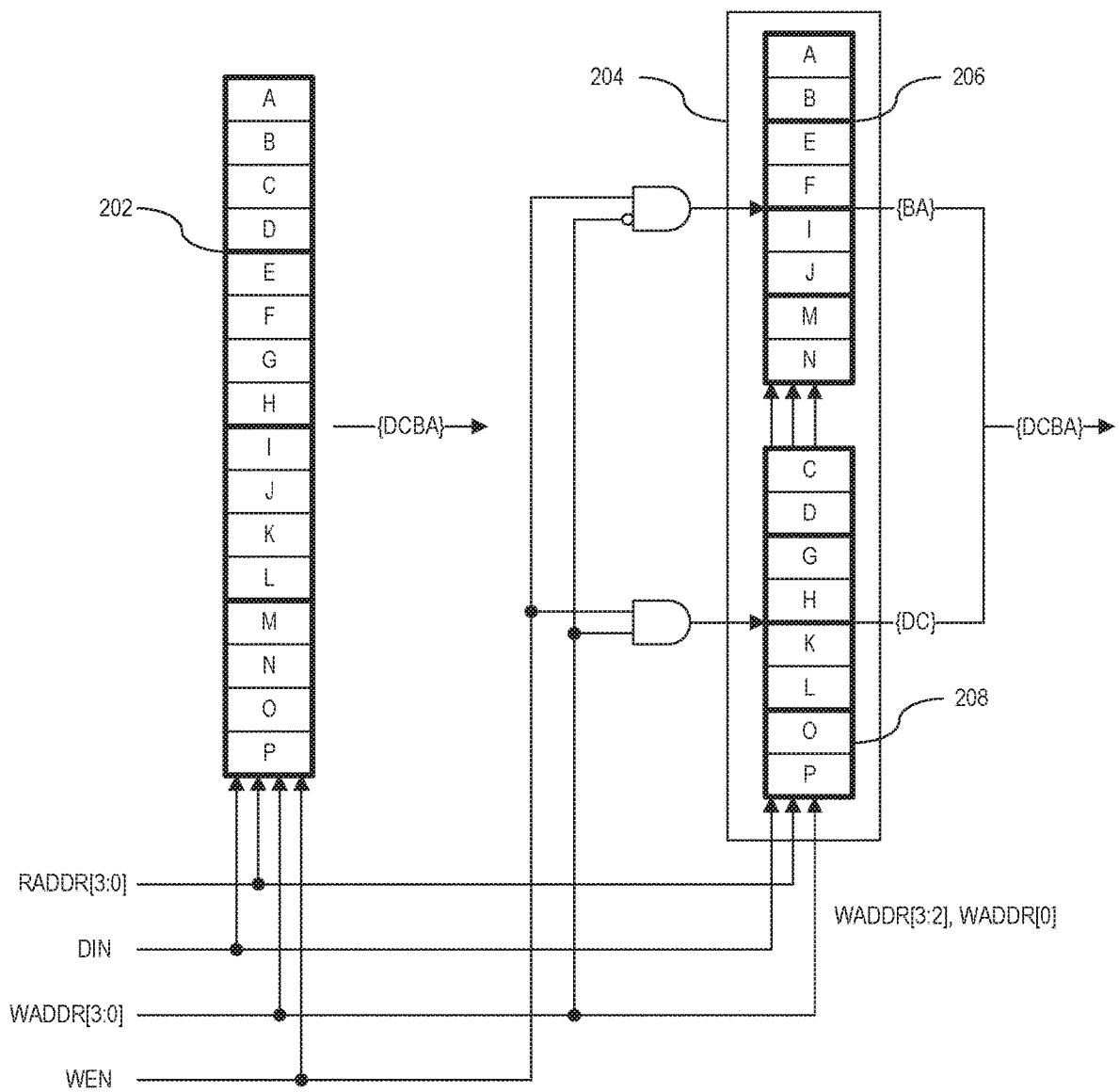
FIG. 5 illustrates a read circuit and a write circuit generated by the system to implement the RAM circuit of FIG. 2.

FIG. 5 illustrates a read circuit and a write circuit generated by the system to implement RAM circuit 204. In the example of FIG. 5, memory primitives 206 and 208 are used having an aspect ratio of 1:2 to implement RAM circuit 204 having an aspect ratio of 1:4. Signaling for both HDL RAM 202 and RAM circuit 204 is shown to illustrate those signals that may remain the same from HDL to the netlist implementation and those signals that require processing via one or more auxiliary circuits (e.g., read circuit or write circuit).

Figures 6, 7:
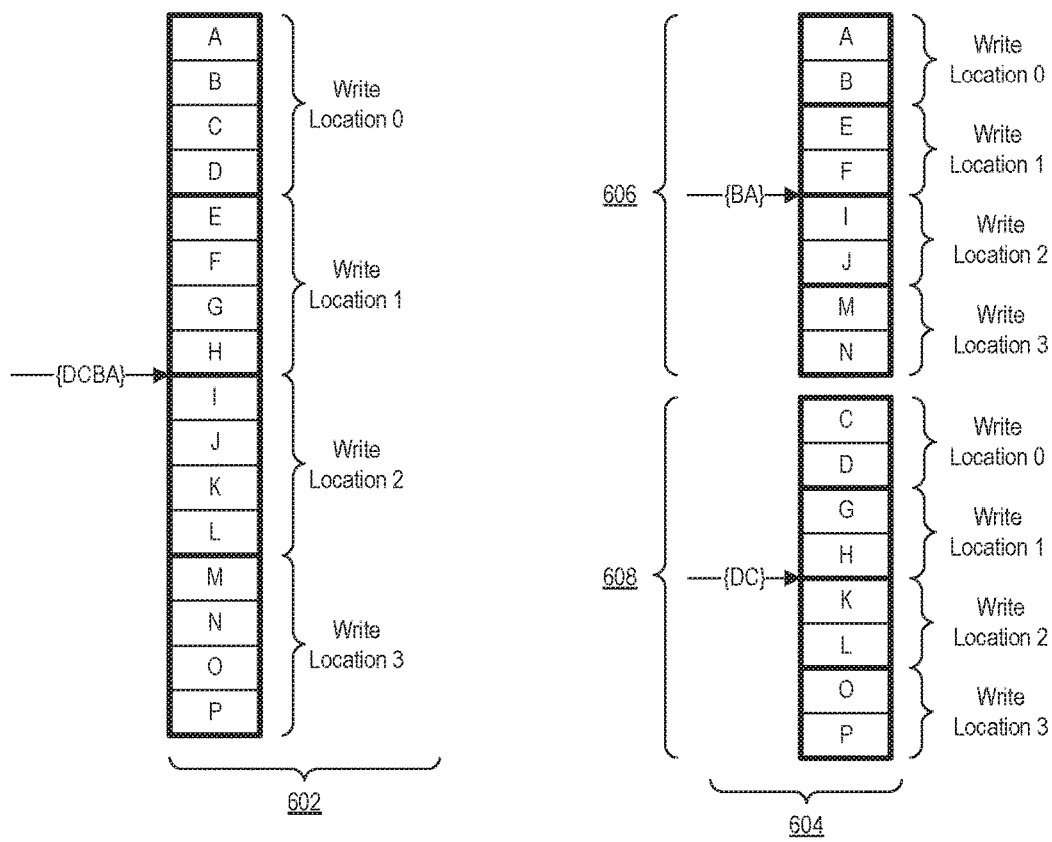
FIG. 6 is a diagram illustrating certain operative features of the system of FIG. 1.
FIG. 7 illustrates read locations and data inputs received by the HDL RAM and the RAM circuit of FIG. 6.

FIG. 6 is a diagram illustrating certain operative features of system 100 of FIG. 1. FIG. 6 illustrates an example HDL RAM 602 and a corresponding RAM circuit 604. HDL RAM 602 and RAM circuit 604 are asymmetric. RAM circuit 604 is derived from HDL RAM 602. FIG. 6 illustrates example data arrangements supporting write operations.

In the example of FIG. 6, consider the case where HDL RAM 602 has an aspect ratio of 1:4 and is to be implemented using memory primitives having a maximum aspect ratio of 1:2. In this example, HDL RAM 602 has a write port that is wider than the read port. This means that HDL RAM 602 is written with 4 consecutive words in a clock cycle and reads out 1 word in a clock cycle. The memory primitive only supports writing 2 consecutive words in a clock cycle.

HDL RAM 602 stores words denoted as A, B, C, D, E, F, G, H, I, J, K, L, M, N, O, and P at consecutive locations. RAM circuit 604 is formed of memory primitives 606, 608, each having a maximum aspect ratio of 1:2 and only capable of writing 2 consecutive words each clock cycle. Accordingly, the words are re-arranged so that the same content, e.g., using a same write address provided to each of memory primitives 606, 608, may be written on each clock cycle. This allows the same content to be written to RAM circuit 604 that is written to HDL RAM 602 each clock cycle. The words are re-arranged to illustrate the location of the words as stored in consecutive locations within memory primitives 606, 608 of RAM circuit 604. To support writing 4 words, RAM circuit 604 is written with two words to each memory primitive 606, 608 each clock cycle. RAM circuit 604 is illustrated without any auxiliary circuits supporting read and write operations for ease of illustration.

FIG. 7 illustrates the read locations and data inputs (DINs) received by HDL RAM 602 and RAM circuit 604 formed of memory primitives 606, 608. To implement RAM circuit 604, the system generates several different circuits. For example, the system generates a core array, a read circuit, and a write circuit. In terms of the read circuit for the example of FIG. 6, a multiplexer is used at the output of RAM circuit 604 to select the particular memory primitive 606, 608 that outputs data for the read operation. The system is capable of using a section of the original read address from the HDL for each memory primitive 606, 608. The system is capable of implementing a read address transformation along with multiplexer select lines based on the table illustrated in FIG. 8.

FIG. 8 is a table illustrating that by controlling the multiplexer, output data can be successfully read from the memory primitives of FIG. 6. Based on the table of FIG. 8, the system is capable of generating the following expressions in implementing the read circuit.

$RADDR_{MP606} == RADDR_{MP608} == \{RADDR[3:2], RADDR[0]\}$ (e.g., Skip RADDR[1])

MUX_SEL=RADDR[1] (registered to match registered or unregistered behavior depending on the particular memory primitives used)

Within the foregoing example expressions, RADDR stands for read address. DOUT stands for data output of the HDL RAM. Again, MP stands for memory primitive.

In terms of the write circuit for the example of FIG. 6, since HDL RAM 602 is capable of writing 4 consecutive words (DCBA) in a clock cycle, the system partitions the input data to write 2 words to each memory primitive 606, 608 each clock cycle. The system segments the input data into two segments and sends the segmented input data to memory primitive 606 and to memory primitive 608 at the same time (e.g., one segment or channel to each). The segmented data may be written to the same address in each of memory primitives 606, 608 at the same time. This condition means that both memory primitives 606, 608 receive the same write enables and write address as HDL RAM 602. For example, the system determines the following expressions:

$WEN_{MP606} == WEN_{MP608} == WEN$ $WADDR_{MP606} == WADDR_{MP608} == WADDR$ $DIN_{MP606}==\{B,A\}, DIN_{MP608}==\{D,C\}$ when
  $DIN=\{D,C,B,A\}$ (e.g., input bus is partitioned
  word-wise and joined and sent to each memory
  primitive)

Figure 9:
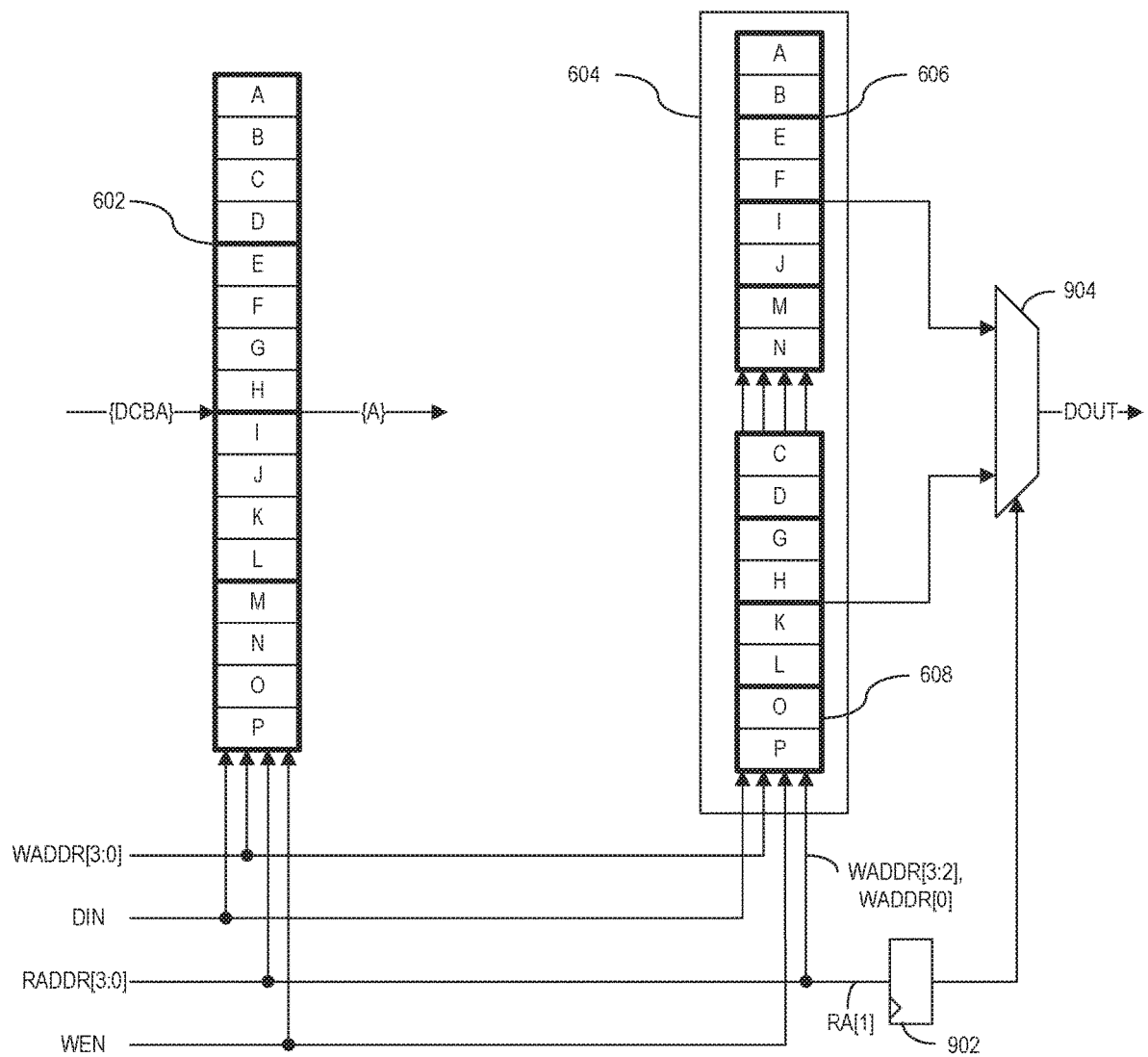
FIG. 9 illustrates a read circuit and a write circuit generated by the system to implement the RAM circuit of FIG. 6.

FIG. 9 illustrates the read circuit and the write circuit generated by the system to implement RAM circuit 604. In the example of FIG. 9, memory primitives 606 and 608 are used having an aspect ratio of 1:2 to implement RAM circuit 604 having an aspect ratio of 1:4. Signaling for both HDL RAM 602 and RAM circuit 604 is shown to illustrate those signals that may remain the same from HDL to the netlist implementation and those signals that require processing via one or more auxiliary circuits (e.g., read circuit or write circuit). In the example of FIG. 9, the data input (DIN) is segmented such that, for example, the DIN of "DCBA" is segmented so that memory primitive 606 receives "BA" and memory primitive 608 receives "DC".

The RA[1] bit is provided through register 902 as a select signal to multiplexer 904. Multiplexer 904 outputs data from memory primitive 606 or from memory 608 based on the select signal.

Figure 10:
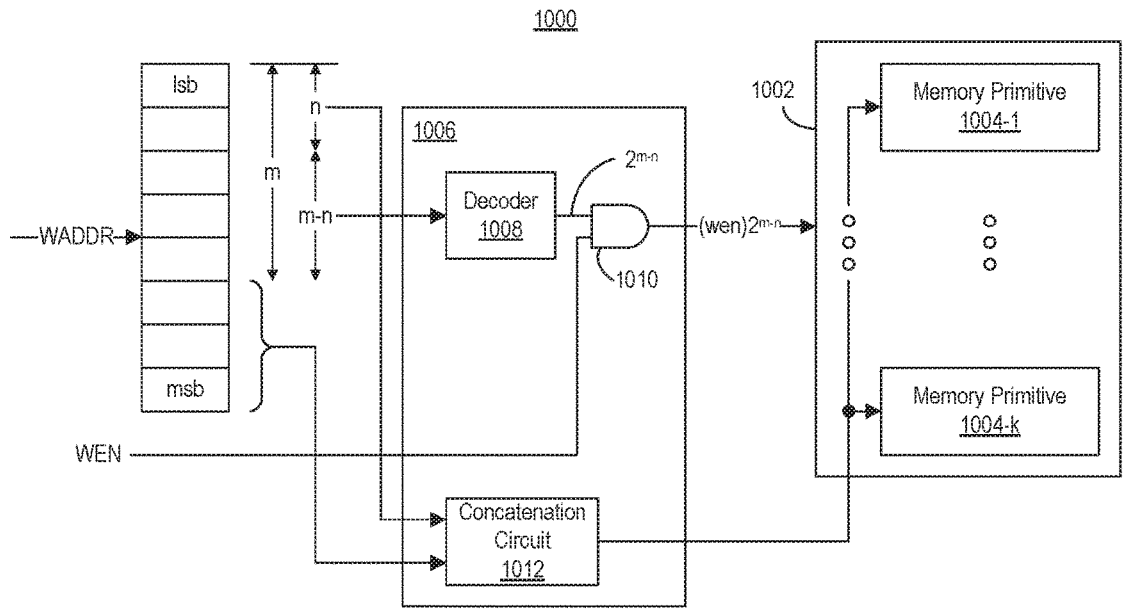
FIG. 10 illustrates an example where the system generates a write circuit for an asymmetric HDL RAM.

FIG. 10 illustrates an example where the system generates a write circuit 1006 for a RAM circuit 1000 generated from an asymmetric HDL RAM. In the example of FIG. 10, the write port is the base port. RAM circuit 1000 includes a core array 1002. Core array 1002 includes a plurality of memory primitives 1004 shown as memory primitive 1004-1 through 1004-k, where k in an integer value of 2 or more. In the examples described herein, k is the number of memory primitives included in the core arrays.

In one aspect, the system determines that the number of memory primitives included in core array 1002 is "M/N" where 1:M is the maximum port width ratio of the HDL RAM and 1:N is the maximum port width ratio of the memory primitive to be used to build the RAM circuit. In the examples to follow, constraints such as M>N and both M and N being powers of 2 are observed. Thus, for example, given an asymmetric HDL RAM of 1:32, where M=32 and a memory primitive of 1:4, where N=4, M/N=8. Core array 1002 would include 8 memory primitives 1004 (k=8).

In another aspect, the number of memory primitives 1004 in core array 1002 may be calculated as follows:

Let $m=\log_2 M$;

Let $n=\log_2 N$; and $2^{(m-n)}$ is the number of memory primitives in the core array.

Thus, consider the following example where $M=32==2^5$, $m=5$; and $N=4==2^2$, $n=2$. The system is capable of calculating the total number of memory primitives in core array 1002 as $2^{(m-n)}=2^{(5-2)}=2^3=8$.

Write circuit 1006 includes a decoder 1008, an AND circuit (e.g., gate) 1010, and a concatenation circuit 1012. In the example, the system provides bits WADDR[m−1:n] of WADDR to decoder 1008. Decoder 1008 generates 2^(m−n) signals, which is one per memory primitive. The system provides the remaining bits WADDR[msb:m] and WADDR[n:lsb], e.g., those bits other than WADDR[m−1:n], to concatenation circuit 1012. Concatenation circuit 1012 concatenates the received bits. The system couples the output of concatenation circuit 1012 to the respective write ports of memory primitives 1004 to provide write addresses thereto (primitive write addresses). The write enable (WEN) from the HDL RAM is provided to AND circuit 1010. AND circuit 1010 performs a logical AND operation on the output from decoder 1008, which is $2^{(m-n)}$ signals and the WEN to generate the write enables for the respective memory primitives 1004. The system couples the write enable signals generated from AND circuit 1010 to each of write port of each of memory primitives 1004.

Figure 11:
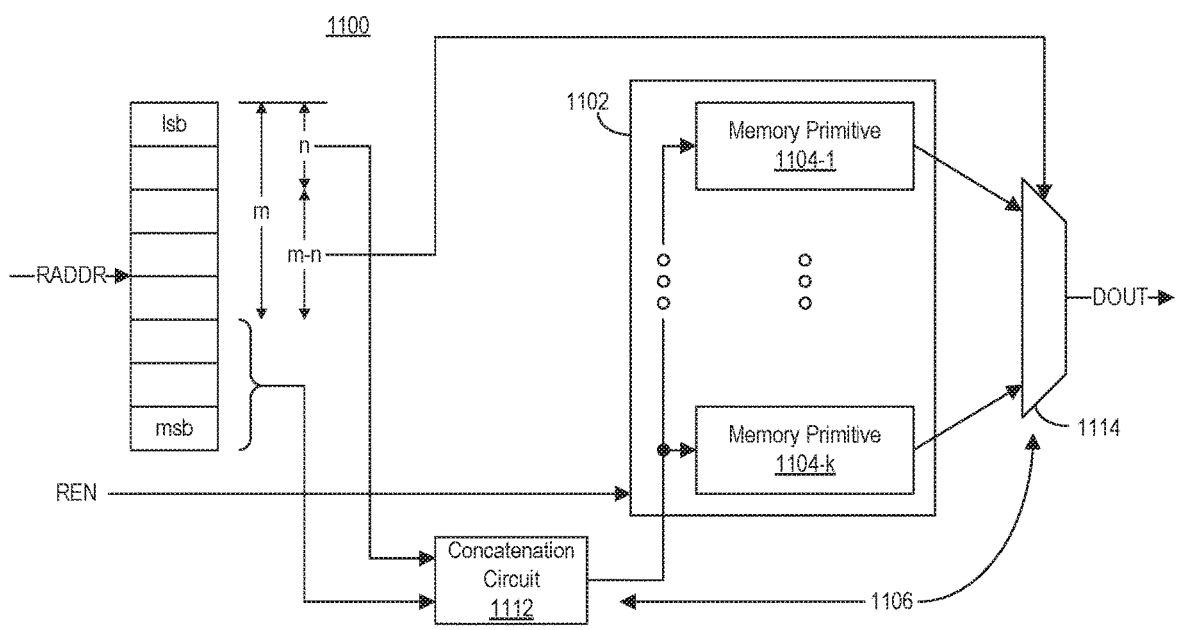
FIG. 11 illustrates an example where the system generates a read circuit for an asymmetric HDL RAM.

FIG. 11 illustrates an example where the system generates a read circuit 1106 for a RAM circuit 1100 generated from an asymmetric HDL RAM. In the example of FIG. 11, the read port is the base port. RAM circuit 1100 includes a core array 1102. Core array 1102 includes a plurality of memory primitives 1104 shown as memory primitive 1104-1 through 1104-k, where k in an integer value of 2 or more equal to the number of memory primitives 1104 included in core array 1102. The system is capable of determining the number of memory primitives as previously described in connection with FIG. 10.

Read circuit 1106 includes a concatenation circuit 1112 and a multiplexer 1114. In the example, the system provides bits RADDR[m−1:n] of the read address to multiplexer 1114 as the select signal. The system provides the remaining bits RADDR[msb:m] and WADDR[n−1:0], e.g., those bits other than RADDR[m−1:n], to concatenation circuit 1112. Concatenation circuit 1112 concatenates the bits. The system couples the output of concatenation circuit 1112 to respective read ports of memory primitives 1104 to provide a read address to each memory primitive, also referred to as a primitive read address. The system provides the read enable (REN) of the HDL circuit design to each of memory primitives 1104.

In the example of FIG. 11, the output (DOUT) is selected from one of the several memory primitives 1104. The exact memory primitive 1104 to be selected using multiplexer 1114 is selected based on the original read address signal that is provided (e.g., bits RADDR[m−1:n] of the read address signal). The primitive read address provided to each memory primitive 1104 is identical and is a section from the original read address of the HDL RAM.

Figure 12:
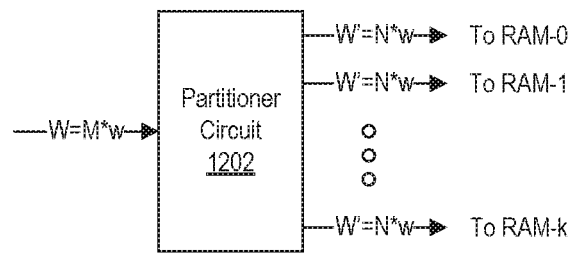
FIG. 12 illustrates an example of a write data transformation implemented by the system for a write port of an asymmetric RAM circuit.

FIG. 12 illustrates an example of a write data transformation implemented by the system for a write port of an asymmetric RAM circuit. In the example of FIG. 12, the write port is the asymmetric port. For purposes of explanation:

Let w=width of the Base Port (narrow port) of the HDL RAM;
W=width of the Asymmetric Port of the HDL RAM;
  W=M*w where the HDL RAM port width ratio=1:M;
W=width of the Asymmetric Port of the memory primitive;
  W=N*w where the memory primitive has a maximum port width ratio=1:N; and
M/N=the total number of memory primitives the core array.

In the example of FIG. 12, the HDL RAM's input data bus width=W (==M*w). The system uniformly segments or partitions the input data bus into M/N segments using partitioner circuit 1202. Partitioner circuit 1202 provides each segment to one of the memory primitives of the core array. Thus, each memory primitive receives one of the resulting segments from partitioner circuit 1202.

Figure 13:
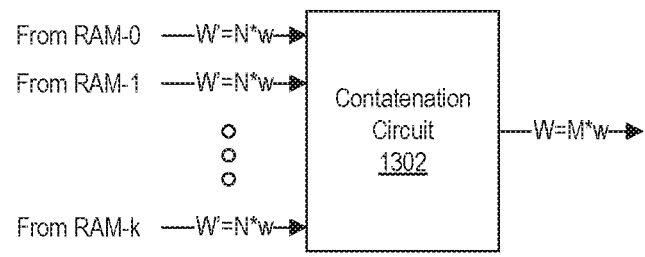
FIG. 13 illustrates an example of a read data transformation implemented by the system for a write port of an asymmetric RAM circuit.

FIG. 13 illustrates an example of a read data transformation implemented by the system for a write port of an asymmetric RAM circuit. In the example of FIG. 12, the read port is the asymmetric port. In the example of FIG. 13, the read data out (DOUT) of the HDL RAM is W bits, while the read data out for each memory primitive is W bits. The system concatenates the read data outputs from the memory primitives using concatenation circuit 1302. The read address and the read enable provided to the read port of each respective memory primitive is the same as the original HDL circuit design.

Figure 14:
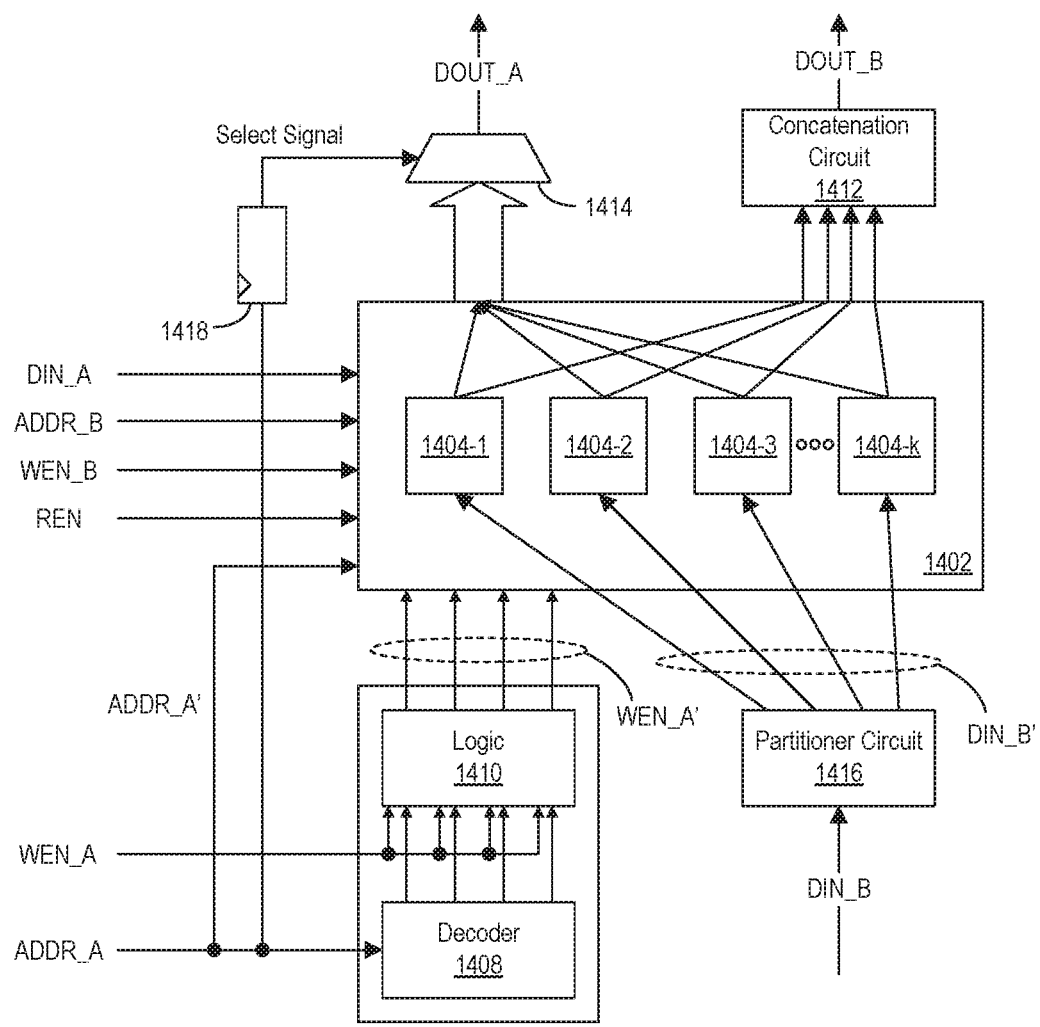
FIG. 14 illustrates an example of a true dual port asymmetric RAM circuit as implemented by the system.

FIG. 14 illustrates an example of a true dual port asymmetric RAM circuit 1400 as implemented by the system. The system, for example, implements RAM circuit 1400 from an HDL RAM having a maximum port width ratio of 1:M using memory primitives having a maximum port width ratio of 1:N. In the example of FIG. 14, RAM circuit 1400 has two ports A and B, each capable of reading and writing data to core array 1402.

The system generates core array 1402 having M/N memory primitives 1404-1 to 1404-k. In the example of FIG. 14, port A is the base port while port B is the asymmetric port. In terms of reading on port A, the system generates a multiplexer 1414 at the output of core array 1402 to selectively output data from one of memory primitives 1404 at a time to generate DOUT_A. Multiplexer 1414 receives bits ADDR_A[m−1:n] of the (read) address for port A as the select signal via register 1418. The remaining bits of the address for port A are concatenated and provided to the respective read ports of memory primitives 1404 to provide read addresses. The system provides the read enable (REN) of the HDL circuit design to each of memory primitives 1404.

In terms of writing for port A, the (write) address for port A is split and provided to decoder 1408. Decoder 1408 receives bits ADDR_A[m−1:n], e.g., (m−n) bits and produces 2"(m−n) signals, which is one for each memory primitive. The write enable (WEN_A) of the circuit design and the decoded bits from decoder 1408 are provided to logic 1406 to generate write enables to core array 1402. Logic 1410, for example, may and each bit output from decoder with WEN_A to generate WEN_A' that may be provided to each memory primitive 1404. The system further provides the remaining bits of ADDR_A, e.g., those bits other than ADDR_A[m−1:n], to a concatenation circuit as illustrated in FIG. 10 (not shown in FIG. 14) that concatenates the bits. The system couples the concatenated bits (e.g., ADDR_A') to the respective write ports of memory primitives 1004 to provide primitive write addresses.

In terms of reading for port B, the system implements concatenation circuit 1412 to concatenate the outputs from memory primitives 1404 to generate DOUT_B. The system uses the same read addresses (ADDR_B) and same read enable as used in the HDL circuit design.

In terms of writing for port B, the system splits the received data DIN_B into a number of segments (e.g., channels) corresponding to the k memory primitives and provides one segment to each memory primitive 1404 using partitioner circuit 1416. The write addresses (ADDR_B) and the write enable (WEN_B) provided to each memory primitive 1404 are the same as used or obtained from the HDL RAM.

FIG. 15 is an example method 1500 illustrating operations performed by a system to implement a RAM circuit derived from an HDL RAM of a circuit design. The RAM circuit and the HDL RAM are asymmetric. Method 1500 may be implemented using a system as described herein in connection with FIGS. 1 and 17.

In block 1502, the system is capable of detecting an HDL RAM within a circuit design. The HDL RAM is an asymmetric RAM. In block 1504, the system is capable of determining a number of a plurality of memory primitives needed to implement the HDL RAM as a RAM circuit. For example, the system determines the number of memory primitives needed to implement the core array of the RAM circuit. In one aspect, the system determines the number of memory primitives based on a maximum port width ratio of the memory primitives defined as 1:N and a port width ratio of the HDL RAM defined as 1:M. Each of M and N is an integer and a power of two. Further, M exceeds N. The RAM circuit that is implemented from the HDL RAM is also asymmetric. In block 1506, the system is capable of generating a write circuit for a first port of the RAM circuit. In block 1508, the system is capable of generating a read circuit for a second port of the RAM circuit.

The foregoing and other implementations can each optionally include one or more of the following features, alone or in combination. Some example implementations include all the following features in combination.

For example, in one aspect, the first port is a narrow (base) port of the RAM circuit. In that case, the system is capable of configuring the write circuit to generate write enable signals to each of the plurality of memory primitives based on a subset of bits of a write address of the HDL RAM and a write enable of the HDL RAM. The system is further capable of configurating the write circuit to concatenate remaining bits of the write address of the HDL RAM to generate a primitive write address that is provided to each memory primitive of the plurality of the memory primitives of the RAM circuit. An example of the write circuit that may be generated is described in connection with FIG. 10.

The subset of bits of the write address of the HDL RAM may be selected based on a log of M and a log of N.

In another aspect, the second port is a wide (asymmetric) port of the RAM circuit. In that case, the system is capable of configuring the read circuit to concatenate outputs from the plurality of memory primitives of the RAM circuit to form an output for the RAM circuit. Further, the system is capable of using the read enable of the HDL RAM for each memory primitive of the RAM circuit. An example of the read circuit that may be generated is described in connection with FIG. 13.

In another aspect, the first port is a wide port of the RAM circuit. In that case, the system is capable of configuring the write circuit to divide input data of the RAM circuit into a number of segments corresponding to the number of the plurality of memory primitives and provide each segment to one of the plurality of memory primitives. The system is capable of using write enables and write addresses of the HDL RAM for each memory primitive of the plurality of memory primitives of the RAM circuit. An example of the write circuit that may be generated is described in connection with FIG. 12.

In another aspect, the second port is a narrow port of the RAM circuit. In that case, the system is capable of configuring the read circuit to selectively pass data read from a selected memory primitive of the plurality of memory primitives based on a subset of bits of a read address of the HDL RAM. The system is further capable of configuring the read circuit to concatenate remaining bits of the read address of the HDL RAM to generate a primitive read address provided to each memory primitive of the plurality of the memory primitives of the RAM circuit. An example of the read circuit that may be generated is described in connection with FIG. 11.

The subset of bits of the write address of the HDL RAM may be selected based on a log of M and a log of N.

Figure 16:
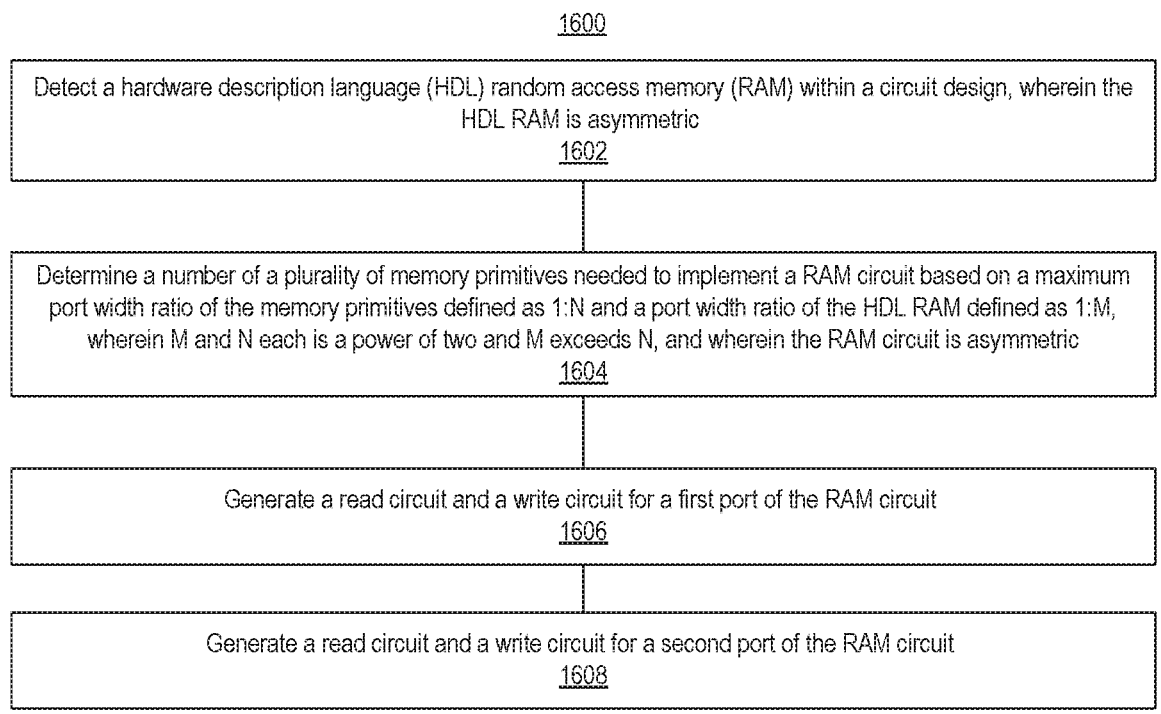
FIG. 16 is another example method illustrating operations performed by a system to implement a RAM circuit derived from an HDL RAM of a circuit design.

FIG. 16 is another example method 1600 illustrating operations performed by a system to implement a RAM circuit derived from an HDL RAM of a circuit design. The RAM circuit and the HDL RAM are symmetric. The RAM circuit may be a true dual port RAM. Method 1600 may be implemented using a system as described herein in connection with FIGS. 1 and 17.

In block 1602, the system is capable of detecting an HDL RAM within a circuit design. The HDL RAM is asymmetric and is a true dual port RAM. In block 1604, the system is capable of determining a number of a plurality of memory primitives needed to implement the HDL RAM as a RAM circuit as described herein. The RAM circuit is an asymmetric RAM. In block 1606, the system is capable of generating a read circuit and a write circuit for a first port of the RAM circuit. The first port may be the base port of the HDL RAM and the RAM circuit. In block 1608, the system is capable of generating a read circuit and a write circuit for a second port of the RAM circuit. The second port may be the asymmetric port of the HDL RAM and the RAM circuit.

The read and/or write circuitry implemented by the system during the process described in connection with FIG. 16 may be any of the corresponding read and/or write circuits described herein. In one example, the system generates a RAM circuit the same as or similar to that of FIG. 14.

Figure 17:
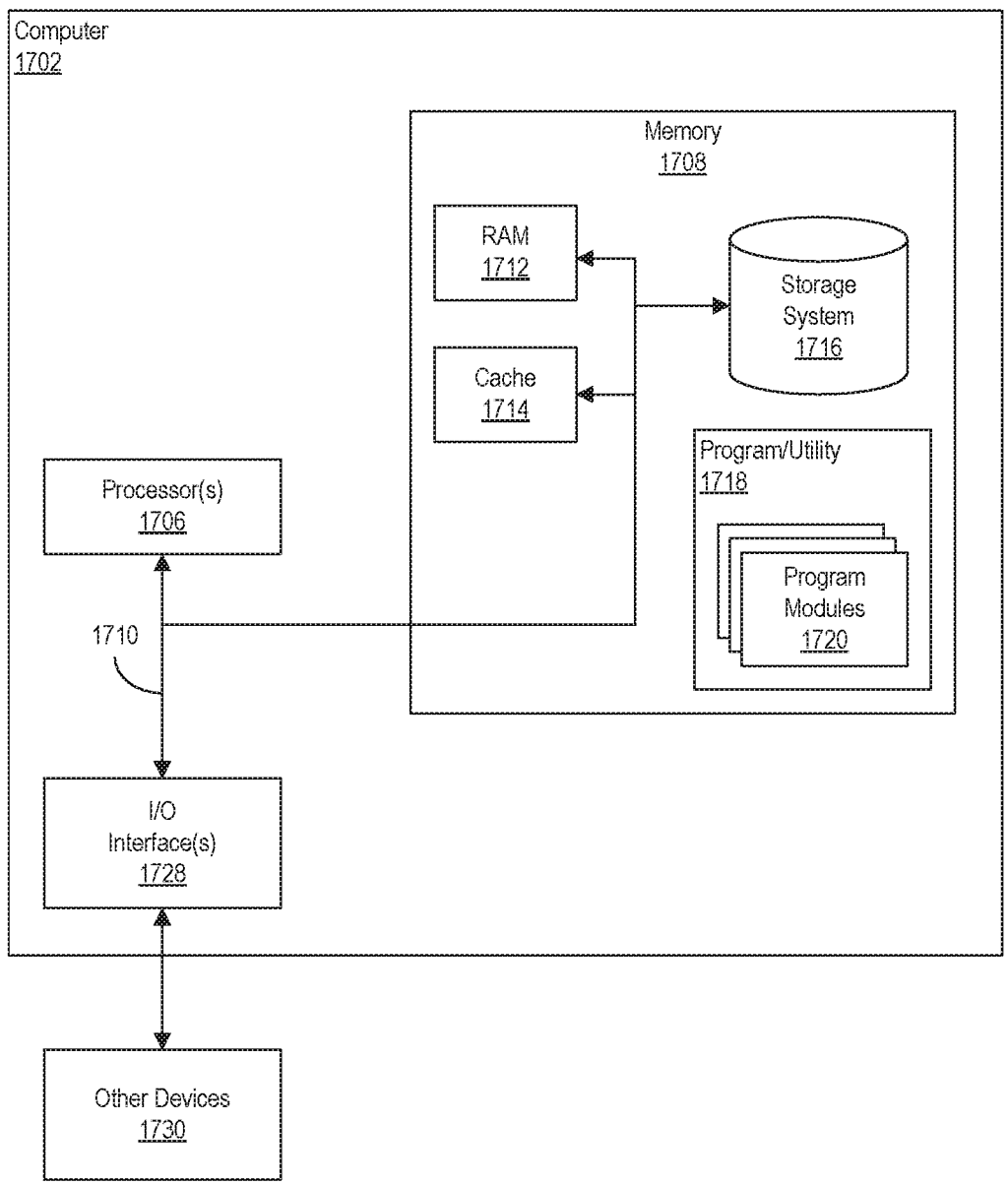
FIG. 17 illustrates an example computer for use with the inventive arrangements described within this disclosure.

FIG. 17 illustrates an example computer 1702 for use with the inventive arrangements described within this disclosure. The components of computer 1702 may include, but are not limited to, one or more processors 1706 (e.g., central processing units), a memory 1708, and a bus 1710 that couples various system components including memory 1708 to processor(s) 1706. Processor(s) 1706 may include any of a variety of processors that are capable of executing program code. Example processor types include, but are not limited to, processors having an x86 type of architecture (IA-32, IA-64, etc.), Power Architecture, ARM processors, and the like.

Bus 1710 represents one or more of any of several types of communication bus structures, including a memory bus or memory controller, a peripheral bus, an accelerated graphics port, and a processor or local bus using any of a variety of available bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, Peripheral Component Interconnect (PCI) bus, and PCI Express (PCIe) bus.

Computer 1702 typically includes a variety of computer readable media. Such media may be any available media that is accessible by computer 1702 and may include any combination of volatile media, non-volatile media, removable media, and/or non-removable media.

Memory 1708 may include computer readable media in the form of volatile memory, such as random-access memory (RAM) 1712 and/or cache memory 1714. Computer 1702 may also include other removable/non-removable, volatile/non-volatile computer system storage media. By way of example, storage system 1716 may be provided for reading from and writing to a non-removable, non-volatile magnetic and/or solid state media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each may be connected to bus 1710 by one or more data media interfaces. Memory 1708 is an example of at least one computer program product having a set (e.g., at least one) of program modules (e.g., program code) configured to carry out the functions and/or operations described within this disclosure.

For example, program/utility 1718 includes a set (at least one) of program modules 1720. Program modules 1720, being stored in memory 1708, may include, but are not limited to, an operating system, one or more application programs (e.g., user applications), other program modules, and/or program data. Program modules 1720 generally carry out the functions and/or methodologies as described herein at least with respect to operations performed by computer 1702. For example, program modules 1720 may implement an Electronic Design Automation (EDA) system capable of performing the operations described herein such as synthesis, placement, routing, bitstream generation, and/or loading a placed and routed circuit design (e.g., a bitstream) into a programmable IC.

Program/utility 1718 is executable by processor(s) 1706. Program/utility 1718 and any data items used, generated, and/or operated upon by processor(s) 1706 are functional data structures that impart functionality when employed by host processor(s) 1706. As defined within this disclosure, a "data structure" is a physical implementation of a data model's organization of data within a physical memory. As such, a data structure is formed of specific electrical or magnetic structural elements in a memory. A data structure imposes physical organization on the data stored in the memory as used by an application program executed using a processor.

Computer 1702 may include one or more Input/Output (I/O) interfaces 1728 communicatively linked to bus 1710. I/O interface(s) 1728 allow computer 1702 to communicate with one or more other devices 1730. Examples of I/O interfaces 1728 may include, but are not limited to, network cards, modems, network adapters, hardware controllers, etc. Other devices 1730 allow user(s) to interact with computer 1702, allow computer 1702 to communicate with other computing devices, and the like. Examples of other devices 1730 include, but are not limited to, a display, a hardware acceleration card, a keyboard, and the like.

FIG. 17 is not intended to suggest any limitation as to the scope of use or functionality of the examples described herein. Computer 1702 is an example of computer hardware (e.g., a system) that is capable of performing the various operations described within this disclosure.

Computer 1702 is only one example implementation of a computing system. Computer 1702 is shown in the form of a computing device, e.g., a computer or server. In one aspect, computer 1702 can be practiced within a datacenter. For example, computer 1702 may be practiced as a standalone device, as a bare metal server, in a cluster, or in a distributed cloud computing environment. In a distributed cloud computing environment, tasks are performed by remote processing devices that are linked through a communications network. In a distributed cloud computing environment, program modules may be located in both local and remote computer system storage media including memory storage devices.

As used herein, the term "cloud computing" refers to a computing model that facilitates convenient, on-demand network access to a shared pool of configurable computing resources such as networks, servers, storage, applications, ICs (e.g., programmable ICs) and/or services. These computing resources may be rapidly provisioned and released with minimal management effort or service provider interaction. Cloud computing promotes availability and may be characterized by on-demand self-service, broad network access, resource pooling, rapid elasticity, and measured service.

Computer 1702 is operational with numerous other general-purpose or special-purpose computing system environments or configurations. Examples of computing systems, environments, and/or configurations that may be suitable for use with computer 1702 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Figure 18:
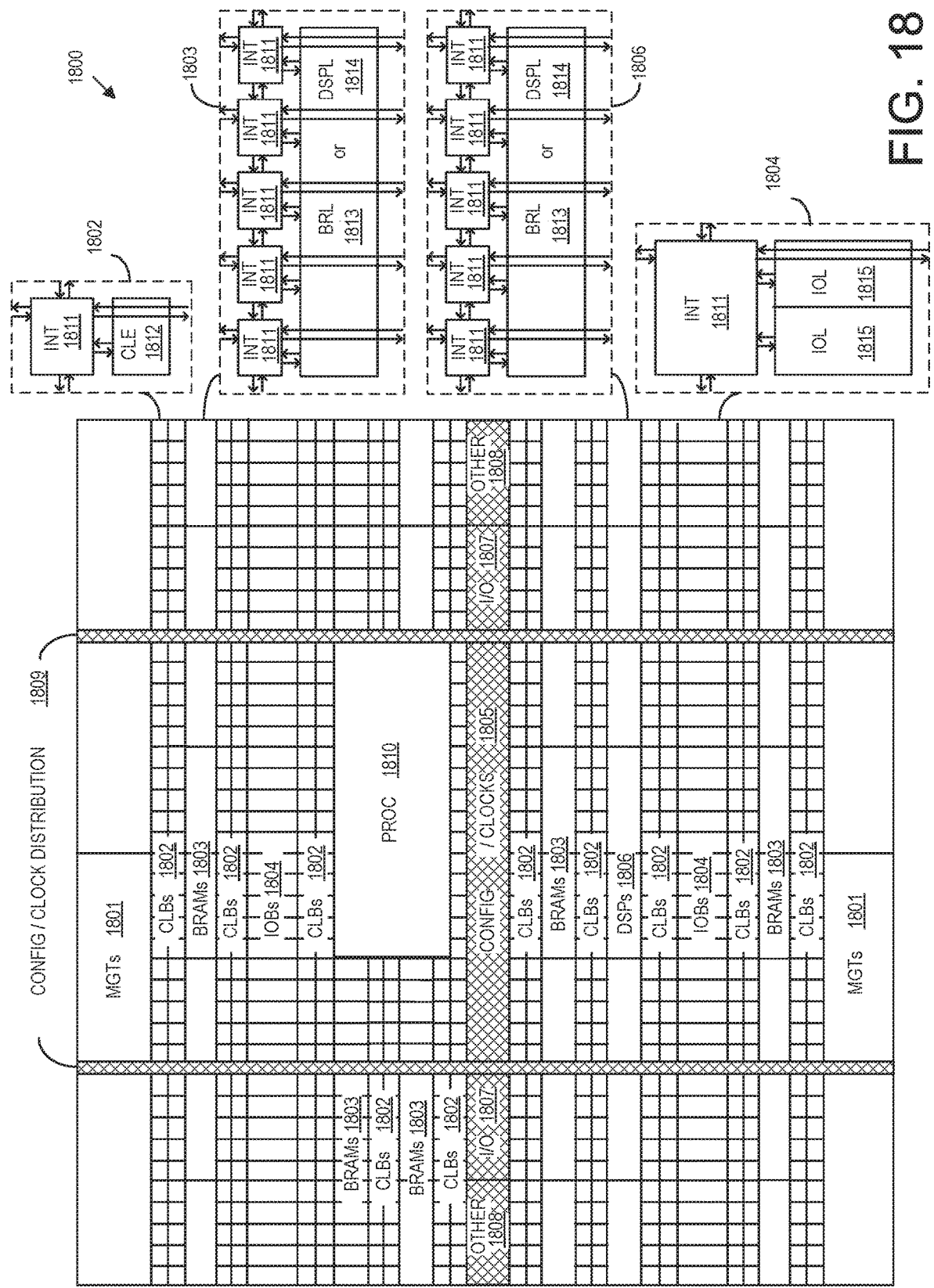
FIG. 18 illustrates an example architecture for an integrated circuit (IC).

FIG. 18 illustrates an example architecture 1800 for an IC. An IC implemented with architecture 1800 or one similar thereto may be used as a target IC to implement a circuit design including an asymmetric HDL RAM as described herein. The resulting RAM circuit as generated by the system may be implemented using programmable circuitry of the IC and using available memory primitives of the IC.

In one aspect, architecture 1800 may be implemented within a programmable IC. For example, architecture 1800 may be used to implement an FPGA. Architecture 1800 may also be representative of a system-on-chip (SoC) type of IC. An SoC is an IC that includes a processor that executes program code and one or more other circuits. The other circuits may be implemented as hardwired circuitry, programmable circuitry, and/or a combination thereof. The circuits may operate cooperatively with one another and/or with the processor.

As shown, architecture 1800 includes several different types of programmable circuit, e.g., logic, blocks. For example, architecture 1800 may include a large number of different programmable tiles including multi-gigabit transceivers (MGTs) 1801, configurable logic blocks (CLBs) 1802, random access memory blocks (BRAMs) 1803, input/output blocks (IOBs) 1804, configuration and clocking logic (CONFIG/CLOCKS) 1805, digital signal processing blocks (DSPs) 1806, specialized I/O blocks 1807 (e.g., configuration ports and clock ports), and other programmable logic 1808 such as digital clock managers, analog-to-digital converters, system monitoring logic, and so forth.

In some ICs, each programmable tile includes a programmable interconnect element (INT) 1811 having standardized connections to and from a corresponding INT 1811 in each adjacent tile. Therefore, INTs 1811, taken together, implement the programmable interconnect structure for the illustrated IC. Each INT 1811 also includes the connections to and from the programmable logic element within the same tile, as shown by the examples included at the right of FIG. 18.

For example, a CLB 1802 may include a configurable logic element (CLE) 1812 that may be programmed to implement user logic plus a single INT 1811. A BRAM 1803 may include a BRAM logic element (BRL) 1813 in addition to one or more INTs 1811. Typically, the number of INTs 1811 included in a tile depends on the height of the tile. As pictured, a BRAM tile has the same height as five CLBs, but other numbers (e.g., four) also may be used. A DSP tile 1806 may include a DSP logic element (DSPL) 1814 in addition to an appropriate number of INTs 1811. An IOB 1804 may include, for example, two instances of an I/O logic element (IOL) 1815 in addition to one instance of an INT 1811. The actual I/O pads connected to IOL 1815 may not be confined to the area of IOL 1815.

BRAM 1803 is an example of a memory primitive. It should be appreciated that memory primitives other than BRAM 1803 may be used and that the inventive arrangements described herein may be used with any of a variety of different memory primitives that conform with the principles and guidelines described herein.

In the example pictured in FIG. 18, a horizontal area near the center of the die, e.g., formed of regions 1805, 1807, and 1808, may be used for configuration, clock, and other control logic. Vertical areas 1809 extending from this horizontal area may be used to distribute the clocks and configuration signals across the breadth of the programmable IC.

Some ICs utilizing the architecture illustrated in FIG. 18 include additional logic blocks that disrupt the regular columnar structure making up a large part of the IC. The additional logic blocks may be programmable blocks and/or dedicated circuitry. For example, a processor block depicted as PROC 1810 spans several columns of CLBs and BRAMs.

In one aspect, PROC 1810 may be implemented as dedicated circuitry, e.g., as a hardwired processor, that is fabricated as part of the die that implements the programmable circuitry of the IC. PROC 1810 may represent any of a variety of different processor types and/or systems ranging in complexity from an individual processor, e.g., a single core capable of executing program code, to an entire processor system having one or more cores, modules, co-processors, interfaces, or the like.

In another aspect, PROC 1810 may be omitted from architecture 1800 and replaced with one or more of the other varieties of the programmable blocks described. Further, such blocks may be utilized to form a "soft processor" in that the various blocks of programmable circuitry may be used to form a processor that can execute program code as is the case with PROC 1810.

The phrase "programmable circuitry" refers to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, circuit blocks shown in FIG. 18 that are external to PROC 1810 such as CLBs 1802 and BRAMs 1803 are considered programmable circuitry of the IC.

In general, the functionality of programmable circuitry is not established until configuration data is loaded into the IC. A set of configuration bits may be used to program programmable circuitry of an IC such as an FPGA. The configuration bit(s) typically are referred to as a "configuration bitstream." In general, programmable circuitry is not operational or functional without first loading a configuration bitstream into the IC. The configuration bitstream effectively implements a particular circuit design within the programmable circuitry. The circuit design specifies, for example, functional aspects of the programmable circuit blocks and physical connectivity among the various programmable circuit blocks.

Circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 1810.

In some instances, hardwired circuitry may have one or more operational modes that can be set or selected according to register settings or values stored in one or more memory elements within the IC. The operational modes may be set, for example, through the loading of a configuration bitstream into the IC. Despite this ability, hardwired circuitry is not considered programmable circuitry as the hardwired circuitry is operable and has a particular function when manufactured as part of the IC.

In the case of an SoC, the configuration bitstream may specify the circuitry that is to be implemented within the programmable circuitry and the program code that is to be executed by PROC 1810 or a soft processor. In some cases, architecture 1800 includes a dedicated configuration processor that loads the configuration bitstream to the appropriate configuration memory and/or processor memory. The dedicated configuration processor does not execute user-specified program code. In other cases, architecture 1800 may utilize PROC 1810 to receive the configuration bitstream, load the configuration bitstream into appropriate configuration memory, and/or extract program code for execution.

FIG. 18 is intended to illustrate an example architecture that may be used to implement an IC that includes programmable circuitry, e.g., a programmable fabric. For example, the number of logic blocks in a column, the relative width of the columns, the number and order of columns, the types of logic blocks included in the columns, the relative sizes of the logic blocks, and the interconnect/logic implementations included at the right of FIG. 18 are purely illustrative. In an actual IC, for example, more than one adjacent column of CLBs is typically included wherever the CLBs appear, to facilitate the efficient implementation of a user circuit design. The number of adjacent CLB columns, however, may vary with the overall size of the IC. Further, the size and/or positioning of blocks such as PROC 1810 within the IC are for purposes of illustration only and are not intended as limitations.

A system as described herein in connection with FIGS. 1 and/or 17, for example, is capable of further processing a circuit design having undergone the processing described herein for implementation within an IC having an architecture the same as or similar to that of FIG. 18. The system, for example, is capable of synthesizing, placing, and routing the circuit design. The system may also perform bitstream generation so that the bitstream may be loaded into the IC, thereby physically implementing the circuit design within the IC.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

As defined herein, the singular forms "a," "an," and "the" are intended to include the plural forms as well, unless the context clearly indicates otherwise.

As defined herein, the terms "at least one," "one or more," and "and/or," are open-ended expressions that are both conjunctive and disjunctive in operation unless explicitly stated otherwise. For example, each of the expressions "at least one of A, B, and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the term "automatically" means without human intervention. As defined herein, the term "user" means a human being.

As defined herein, the term "computer readable storage medium" means a storage medium that contains or stores program code for use by or in connection with an instruction execution system, apparatus, or device. As defined herein, a "computer readable storage medium" is not a transitory, propagating signal per se. A computer readable storage medium may be, but is not limited to, an electronic storage device, a magnetic storage device, an optical storage device, an electromagnetic storage device, a semiconductor storage device, or any suitable combination of the foregoing. The various forms of memory, as described herein, are examples of computer readable storage media. A non-exhaustive list of more specific examples of a computer readable storage medium may include: a portable computer diskette, a hard disk, a RAM, a read-only memory (ROM), an erasable programmable read-only memory (EPROM or Flash memory), an electronically erasable programmable read-only memory (EEPROM), a static random access memory (SRAM), a portable compact disc read-only memory (CD-ROM), a digital versatile disk (DVD), a memory stick, a floppy disk, or the like.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context.

As defined herein, the term "responsive to" and similar language as described above, e.g., "if," "when," or "upon," means responding or reacting readily to an action or event. The response or reaction is performed automatically. Thus, if a second action is performed "responsive to" a first action, there is a causal relationship between an occurrence of the first action and an occurrence of the second action. The term "responsive to" indicates the causal relationship.

As defined herein, the term "processor" means at least one circuit capable of carrying out instructions contained in program code. The circuit may be an integrated circuit or embedded in an integrated circuit.

As defined herein, the term "substantially" means that the recited characteristic, parameter, or value need not be achieved exactly, but that deviations or variations, including for example, tolerances, measurement error, measurement accuracy limitations, and other factors known to those of skill in the art, may occur in amounts that do not preclude the effect the characteristic was intended to provide.

The terms first, second, etc. may be used herein to describe various elements. These elements should not be limited by these terms, as these terms are only used to distinguish one element from another unless stated otherwise or the context clearly indicates otherwise.

A computer program product may include a computer readable storage medium (or media) having computer readable program instructions thereon for causing a processor to carry out aspects of the inventive arrangements described herein. Within this disclosure, the term "program code" is used interchangeably with the term "computer readable program instructions." Computer readable program instructions described herein may be downloaded to respective computing/processing devices from a computer readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations for the inventive arrangements described herein may be assembler instructions, instruction-set-architecture (ISA) instructions, machine instructions, machine dependent instructions, microcode, firmware instructions, or either source code or object code written in any combination of one or more programming languages, including an object oriented programming language and/or procedural programming languages. Computer readable program instructions may include state-setting data. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer readable program instructions by utilizing state information of the computer readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer readable program instructions, e.g., program code.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the operations specified in the flowchart and/or block diagram block or blocks.

The computer readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The corresponding structures, materials, acts, and equivalents of all means or step plus function elements that may be found in the claims below are intended to include any structure, material, or act for performing the function in combination with other claimed elements as specifically claimed.

The description of the inventive arrangements provided herein is for purposes of illustration and is not intended to be exhaustive or limited to the form and examples disclosed. The terminology used herein was chosen to explain the principles of the inventive arrangements, the practical application or technical improvement over technologies found in the marketplace, and/or to enable others of ordinary skill in the art to understand the inventive arrangements disclosed herein. Modifications and variations may be apparent to those of ordinary skill in the art without departing from the scope and spirit of the described inventive arrangements. Accordingly, reference should be made to the following claims, rather than to the foregoing disclosure, as indicating the scope of such features and implementations.

What is claimed is:

1. A method, comprising:
    detecting, using computer hardware, a hardware description language (HDL) random access memory (RAM) within a circuit design, wherein the HDL RAM is asymmetric;
    determining, using the computer hardware, a number of a plurality of memory primitives needed to implement the HDL RAM as a RAM circuit based on a maximum port width ratio of the memory primitives defined as 1:N and a port width ratio of the HDL RAM defined as 1:M, wherein each of M and N is an integer and a power of two and M exceeds N, and wherein the RAM circuit is asymmetric;
    generating, using the computer hardware, a write circuit for a first port of the RAM circuit; and
    generating, using the computer hardware, a read circuit for a second port of the RAM circuit.

2. The method of claim 1, wherein the first port of the RAM circuit is a narrow port, and wherein the write circuit is configured to generate write enable signals to each of the plurality of memory primitives based on a subset of bits of a write address of the HDL RAM and a write enable of the HDL RAM, and concatenate remaining bits of the write address of the HDL RAM to generate a primitive write address provided to each memory primitive of the plurality of the memory primitives of the RAM circuit.

3. The method of claim 2, wherein the subset of bits of the write address of the HDL RAM is selected based on a log of M and a log of N.

4. The method of claim 2, wherein the second port of the RAM circuit is a wide port, and wherein the read circuit is configured to concatenate outputs from the plurality of memory primitives of the RAM circuit to form an output for the RAM circuit, wherein a read enable for the HDL RAM is used for each memory primitive of the RAM circuit.

5. The method of claim 1, wherein the first port of the RAM circuit is a wide port, and wherein the write circuit is configured to divide input data of the RAM circuit into a number of segments corresponding to the number of the plurality of memory primitives and provide each segment to one of the plurality of memory primitives, wherein a write enable and a write address of the HDL RAM are used for each memory primitive of the plurality of memory primitives of the RAM circuit.

6. The method of claim 5, wherein the second port of the RAM circuit is a narrow port, and wherein the read circuit is configured to selectively pass data read from a selected memory primitive of the plurality of memory primitives based on a subset of bits of a read address of the HDL RAM, and concatenate remaining bits of the read address of the HDL RAM to generate a primitive read address provided to each memory primitive of the plurality of the memory primitives of the RAM circuit.

7. The method of claim 6, wherein the subset of bits of the write address of the HDL RAM is selected based on a log of M and a log of N.

8. A system, comprising:
   a processor configured to initiate operations including:
   detecting a hardware description language (HDL) random access memory (RAM) within a circuit design, wherein the HDL RAM is asymmetric;
   determining a number of a plurality of memory primitives needed to implement a RAM circuit based on a maximum port width ratio of the memory primitives defined as 1:N and a port width ratio of the HDL RAM defined as 1:M, wherein each of M and N is an integer and a power of two and M exceeds N, and wherein the RAM circuit is asymmetric;
   generating a write circuit for a first port of the RAM circuit; and
   generating a read circuit for a second port of the RAM circuit.

9. The system of claim 8, wherein the first port of the RAM circuit is a narrow port, and wherein the write circuit is configured to generate write enable signals to each of the plurality of memory primitives based on a subset of bits of a write address of the HDL RAM and a write enable of the HDL RAM, and concatenate remaining bits of the write address of the HDL RAM to generate a primitive write address provided to each memory primitive of the plurality of the memory primitives of the RAM circuit.

10. The system of claim 9, wherein the subset of bits of the write address of the HDL RAM is selected based on a log of M and a log of N.

11. The system of claim 9, wherein the second port of the RAM circuit is a wide port, and wherein the read circuit is configured to concatenate outputs from the plurality of memory primitives of the RAM circuit to form an output for the RAM circuit, wherein a read enable for the HDL RAM is used for each memory primitive of the RAM circuit.

12. The system of claim 8, wherein the first port of the RAM circuit is a wide port, and wherein the write circuit is configured to divide input data of the RAM circuit into a number of segments corresponding to the number of the plurality of memory primitives and provide each segment to one of the plurality of memory primitives, wherein a write enable and a write address of the HDL RAM are used for each memory primitive of the plurality of memory primitives of the RAM circuit.

13. The system of claim 12, wherein the second port of the RAM circuit is a narrow port, and wherein the read circuit is configured to selectively pass data read from a selected memory primitive of the plurality of memory primitives based on a subset of bits of a read address of the HDL RAM, and concatenate remaining bits of the read address of the HDL RAM to generate a primitive read address provided to each memory primitive of the plurality of the memory primitives of the RAM circuit.

14. The system of claim 13, wherein the subset of bits of the write address of the HDL RAM is selected based on a log of M and a log of N.

15. A computer program product, comprising:
   one or more computer readable storage media, and program instructions collectively stored on the one or more computer readable storage media, wherein the program instructions are executable by computer hardware to initiate operations including:
   detecting a hardware description language (HDL) random access memory (RAM) within a circuit design, wherein the HDL RAM is asymmetric;
   determining a number of a plurality of memory primitives needed to implement a RAM circuit based on a maximum port width ratio of the memory primitives defined as 1:N and a port width ratio of the HDL RAM defined as 1:M, wherein each of M and N is an integer and a power of two and M exceeds N, and wherein the RAM circuit is asymmetric;
   generating a write circuit for a first port of the RAM circuit; and
   generating a read circuit for a second port of the RAM circuit.

16. The computer program product of claim 15, wherein the first port of the RAM circuit is a narrow port, and wherein the write circuit is configured to generate write enable signals to each of the plurality of memory primitives based on a subset of bits of a write address of the HDL RAM and a write enable of the HDL RAM, and concatenate remaining bits of the write address of the HDL RAM to generate a primitive write address provided to each memory primitive of the plurality of the memory primitives of the RAM circuit.

17. The computer program product of claim 16, wherein the subset of bits of the write address of the HDL RAM is selected based on a log of M and a log of N.

18. The computer program product of claim 16, wherein the second port of the RAM circuit is a wide port, and wherein the read circuit is configured to concatenate outputs from the plurality of memory primitives of the RAM circuit to form an output for the RAM circuit, wherein a read enable for the HDL RAM is used for each memory primitive of the RAM circuit.

19. The computer program product of claim 15, wherein the first port of the RAM circuit is a wide port, and wherein the write circuit is configured to divide input data of the RAM circuit into a number of segments corresponding to the number of the plurality of memory primitives and provide each segment to one of the plurality of memory primitives, wherein a write enable and a write address of the HDL RAM are used for each memory primitive of the plurality of memory primitives of the RAM circuit.

20. The computer program product of claim 19, wherein the second port of the RAM circuit is a narrow port, and wherein the read circuit is configured to selectively pass data read from a selected memory primitive of the plurality of memory primitives based on a subset of bits of a read address of the HDL RAM, and concatenate remaining bits of the read address of the HDL RAM to generate a primitive read address provided to each memory primitive of the plurality of the memory primitives of the RAM circuit.

* * * * *